United States Patent
Ma

[11] Patent Number: 6,068,892
[45] Date of Patent: May 30, 2000

[54] METHODS AND STRUCTURES FOR PAD RECONFIGURATION TO ALLOW INTERMEDIATE TESTING DURING MANUFACTURE OF AN INTEGRATED CIRCUIT

[75] Inventor: Manny Kin F. Ma, Boise, Id.

[73] Assignee: Micron Technology, Inc., Boise, Id.

[21] Appl. No.: 09/311,218

[22] Filed: May 13, 1999

Related U.S. Application Data

[62] Division of application No. 08/928,390, Sep. 12, 1997.
[51] Int. Cl.[7] .................................................. H01L 21/66
[52] U.S. Cl. ............................... 428/14; 324/765; 438/15; 438/612
[58] Field of Search .................... 438/13, 14, 15, 438/16, 17, 18, 612, 622; 324/765

[56] References Cited

U.S. PATENT DOCUMENTS

| | | | |
|---|---|---|---|
| 5,153,507 | 10/1992 | Fong et al. | 438/15 |
| 5,239,191 | 8/1993 | Sakumoto et al. | 438/18 |
| 5,264,377 | 11/1993 | Chesire et al. | 438/18 |
| 5,444,000 | 8/1995 | Ohkubo et al. | 438/17 |
| 5,532,174 | 7/1996 | Corrigan | 438/18 |
| 5,593,903 | 1/1997 | Beckenbaugh et al. | 438/612 |
| 5,699,282 | 12/1997 | Allen et al. | 438/18 |
| 5,712,571 | 1/1998 | O'Donochue | 438/17 |
| 5,776,791 | 7/1998 | Caillat et al. | 438/17 |

*Primary Examiner*—Kevin M. Picardat
*Attorney, Agent, or Firm*—Arnold, White & Durkee

[57] ABSTRACT

Methods and structures for pad reconfiguration to allow intermediate testing during the manufacture of an integrated circuit are disclosed. The methods and structures disclosed are particularly useful in testing an embedded subcircuit, such as a memory array within an embedded chip product. A bond pad reconfiguration etch and other means for reconfiguring a bond pad are also disclosed.

8 Claims, 7 Drawing Sheets

METHODS AND STRUCTURES FOR PAD RECONFIGURATION TO ALLOW INTERMEDIATE TESTING DURING MANUFACTURE OF AN INTEGRATED CIRCUIT

This is a divisional of co-pending application Ser. No. 08/928,390 filed Sep. 12, 1997.

TECHNICAL FIELD

This invention relates generally to semiconductor manufacturing and more specifically to a method allowing for testing of an integrated circuit during an intermediate stage of its manufacture.

BACKGROUND OF THE INVENTION

Modern semiconductor integrated circuits, or "chips," can be generally divided into two major categories: "microprocessors," which perform logic operations and act generally as the "brains" of electronic systems incorporating them; and "memories," which store data utilized by the microprocessor and other components of electron systems. Traditionally, memory functions and microprocessing functions have been realized on separate chips. However, semiconductor manufacturers are currently pursuing "embedded" designs that incorporate both memory and microprocessor functions on the same chip. Embedded designs are advantageous because a single chip can take the place of separate memory and microprocessor chips, thus saving needed board space in a final computer product in which it is incorporated. Moreover, embedded chips are expected to produce cost savings, higher reliability, and faster speeds when compared to the use of separate memory and microprocessor chips.

However, the manufacture of embedded designs pose significant challenges. Significantly, the processes traditionally used to manufacture memories and microprocessors are different in ways that make their integration on a single chip difficult. For example, the process used to fabricate a Dynamic Random Access Memory (DRAM) cell array is typically quite different from the process used to fabricate the logic gates of a microprocessor. For example, while memories typically only require two metal levels of interconnections, the logic gates of microprocessor circuitry typically call for many more interconnect levels. Thus, the construction of the embedded memory array on a given portion of the embedded chip product will usually be complete at an intermediate stage of the embedded chip's manufacture. The remainder of the process is directed to the completion of the remaining interconnect levels necessary to complete the logic gates for the microprocessor portion of the chip.

However, because the embedded memory array is covered by the remaining levels used to complete the microprocessor portions of the embedded chip product, access to the array is limited, making it difficult to directly test the memory using industry standard memory testing techniques. Moreover, the lack of direct array access makes it difficult to use known redundancy techniques to repair any defects within the embedded memory array.

The present inventions are directed to overcoming or at least reducing the effects of the one or more problems set forth above.

SUMMARY OF THE INVENTION

According to one aspect of the invention, a method for fabricating an integrated circuit is provided. The integrated circuit includes a surface, and the method comprises the steps of: forming a first layer on the surface; forming a second layer over the first layer; forming an opening in the second layer over the first layer; forming a third layer within the opening; forming a fourth layer over the second layer and over the third layer; removing the fourth layer which overlies the opening; removing the third layer from within the opening; and removing the first layer below the opening.

According to another aspect of the invention, a method for electrically testing an integrated circuit is provided. The integrated circuit includes a subcircuit which is operational at an intermediate stage during the processing of the integrated circuit, and the method comprises electrically testing the operational subcircuit during the intermediate stage.

BRIEF DESCRIPTION OF THE DRAWINGS

Other objects and advantages of the invention will become apparent upon reading the following detailed description and upon reference to the drawings in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DESCRIPTION OF ILLUSTRATIVE EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
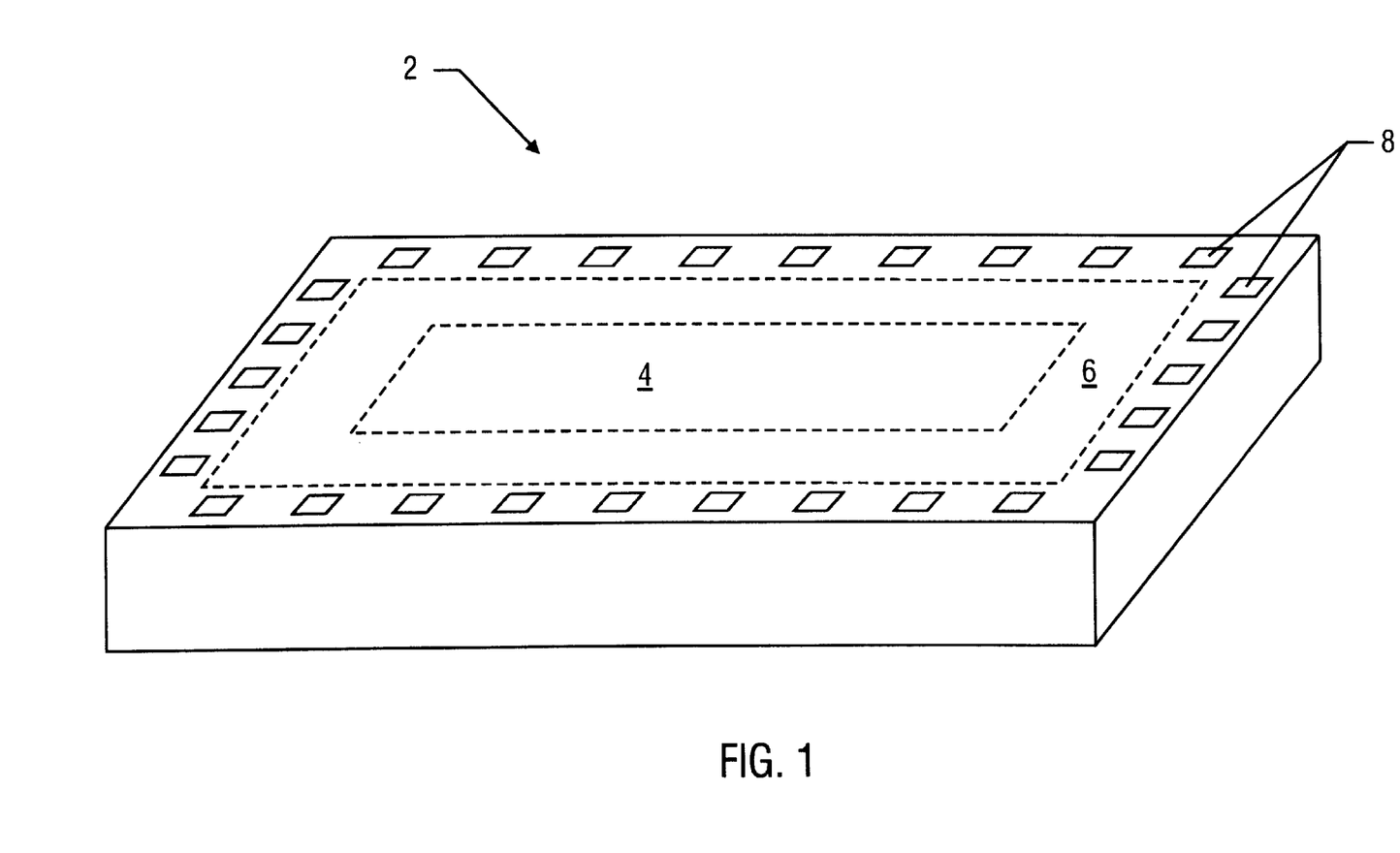
FIG. 1 shows an isometric view of an unpackaged embedded chip product, including an embedded memory array.

FIG. 1 shows an isometric view of a completed embedded chip product 2 that contains two subcircuits: an embedded memory array 4 (such as DRAM memory array) capable of storing data; and logic circuitry 6 capable of performing microprocessor type functions. One of ordinary skill will recognize that bond pads 8 are used to connect the embedded chip product 2 to a suitable carrier or package (not shown). Moreover, the bond pads 8 can be used to test the embedded chip product 2 after the wafer (not shown) on which the embedded chip product 2 is contained has completed manufacture. Such wafer-level testing is typically performed by a multiprobe tester containing a probe card with pins that contact the bond pads 8 and through which electrical signals are sent to test the chip 2. FIG. 1 shows the embedded chip product 2 after multiprobe testing and after the wafer (not shown) on which it has been built has been "diced" to separate the chip 2 from other such chips that have been fabricated on the wafer.

FIGS. 2 through 11B disclose an embodiment of the invention whereby intermediate probe pads 12 are provided to test the embedded memory 4 at an intermediate stage during the manufacture of the embedded chip product 2. In this embodiment, the position of the intermediate probe pads 12 corresponds to the position of the final bond pads 8 that are used to test and bond the final embedded chip product 2, as will be made clear shortly. As disclosed, the embodiment describes an embedded chip 2 that requires three levels of metal interconnects, only two of which are needed to fully fabricate the embedded memory array 4. However, one of ordinary skill will realize that the methods disclosed would be applicable to products incorporating fewer or additional layers of metal or other conductors as well. For example, the embedded memory array 4 could contain three levels of metal, while the logic circuitry 6 could contain four or more layers of metal.

Figures 2, 3:
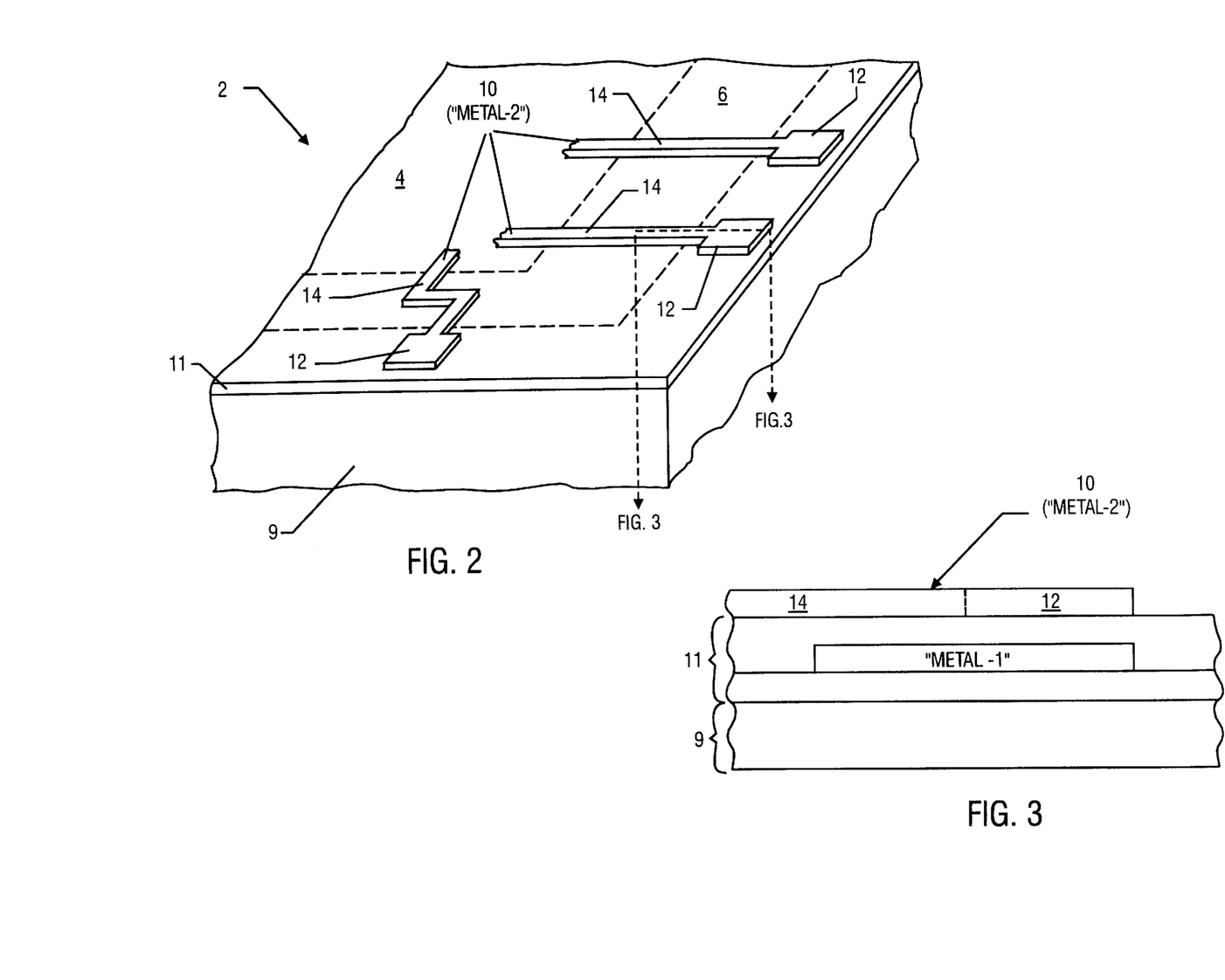
FIG. 2 shows an isometric view of the embedded chip product at an intermediate stage of its manufacture, specifically after the patterning of "metal-2" to form leads and intermediate probe pads.
FIG. 3 shows a cross section through one of the leads and one of the intermediate probe pads of FIG. 2.

FIGS. 2 and 3 respectively show an isometric and cross sectional view a portion of the embedded chip 2 during an intermediate stage of its processing. At this stage, the embedded chip 2 has been completed through the patterning and etching of a second interconnect layer 10, otherwise known as "metal-2". At this stage, the embedded memory array 4, which (in the preferred embodiment) requires only two interconnect layers (i.e., "metal-1" and "metal-2"), is complete and capable of being tested. One of ordinary skill will recognize that many other circuit layers 11 may be present between the "metal-2" layer 10 and a silicon substrate 9, and that these layers form the cells and logic circuits of the embedded memory array 4 and the logic circuitry 6. These layers are not specifically shown in the Figures but comprise various portions of layer 11. Thus, for example, two levels of polycrystalline silicon ("poly") might be present to form traditional "stacked" DRAM cells in the cell array, and a third level of poly might be used to form both the transistor gates of the decoding circuitry and the row lines in the cell array. "Metal-1" might be used, for example, to form the bit lines in the cell array and to interconnect the decoding transistors. Other circuit layers will comprise various portions of layer 11, such as the interlevel dielectrics between the poly and the "metal-1" and the gate dielectrics used in both the transistors and the cells. Similarly, the underlying layers in the logic circuitry 6 will, at this stage, form similar structures such as the logic transistors (although not yet fully interconnected). These other circuit layers 11 are not shown in detail so as not to obscure the inventions disclosed.

As shown in FIG. 2, the "metal-2" layer 10 has been etched to form intermediate probe pads 12. The intermediate probe pads 12 are electrically connected to the completed embedded memory array 4 by way of "metal-2" leads 14. The actual connections to the embedded memory array 4 are not shown, but one of ordinary skill will realize that the leads 14 contact appropriate nodes in the embedded memory array 4. Using the intermediate probe pads 12, the embedded memory array 4 can be electrically tested at this intermediate processing stage using a conventional multiprobe tester. To facilitate testing, the pads 12 preferably, but not necessarily, are connected to the test signals used to test (and operate) a traditional, non-embedded DRAM, such as Vcc (power supply), Vss (ground), RAS (row access strobe), CAS (column address strobe), WE (write enable), OE (output enable), address lines, and data input/output lines. If the pads 12 are connected to these test signals, test programs written for a traditional DRAM chip can be used at this point to test the embedded memory array 4. Intermediate testing of the embedded memory array 4 is advantageous because the logic circuitry 6 is bypassed, allowing failures in the memory array to be "pinpointed" more succinctly and accurately (and, if necessary, fixed via redundancy) through standard memory testing procedures.

Of course, it should be understood that in the completed embedded chip product 2, the embedded memory array 4 will be connected to the logic circuitry 6, and that the logic circuitry 6 will generate the necessary electrical signals to operate the memory array 4. This will be described in more detail shortly.

Figure 4:
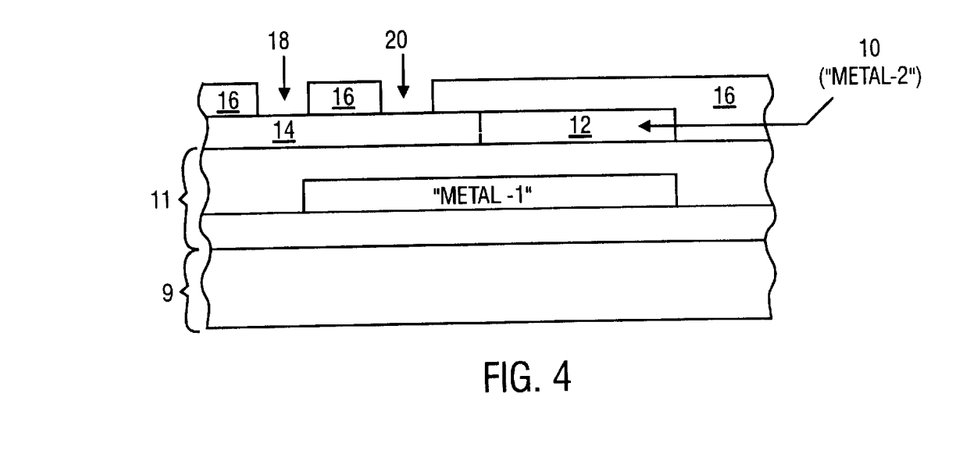
FIG. 4 shows the cross section of FIG. 3 after the formation and etching of a dielectric layer to form a via and an opening over the lead.

FIG. 4 shows the resulting structure after the deposition and etching of a dielectric layer 16 over the structure of the embedded chip product 2 of FIGS. 2 and 3. The dielectric layer 16 has been etched to form both a via 18 and an opening 20, whose respective functions will become clear shortly. The dielectric layer 16 can be any suitable dielectric such as BPSG, TEOS or other silane-based silicon oxides traditionally used between metal layers in a semiconductor process. Methods for deposition and etching such a suitable dielectric are well known to those of ordinary skill in the art of semiconductor fabrication.

Figure 5A:
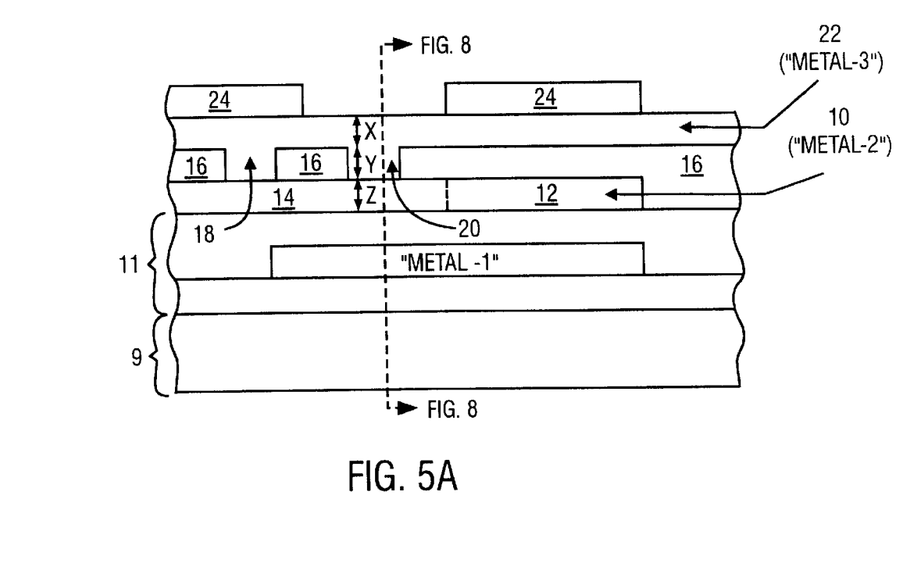
FIG. 5A shows the cross section of FIG. 4 after the deposition of "metal-3" and the development of an overlying photoresist layer.

FIG. 5A shows the resulting structure after the deposition of a third interconnect layer 22 ("metal-3"). Notice that the "metal-3" layer 22 deposits into and fills both the via 18 and the opening 20. FIG. 5A also shows the placement of a photoresist layer 24 on top of the "metal-3" layer 22. The photoresist layer 24 has been exposed and developed using industry standard procedures known to one of ordinary skill.

Figure 6:
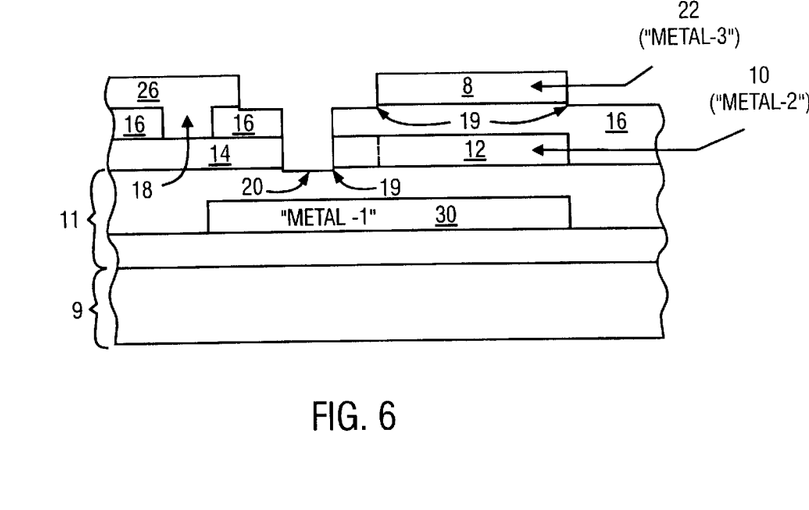
FIG. 6 shows the cross section of FIG. 5A after a reconfiguration etch has removed the "metal-3" from over and within the opening and the "metal-2" from a portion of the lead, thereby severing the lead from the intermediate probe pad.
Figure 7:
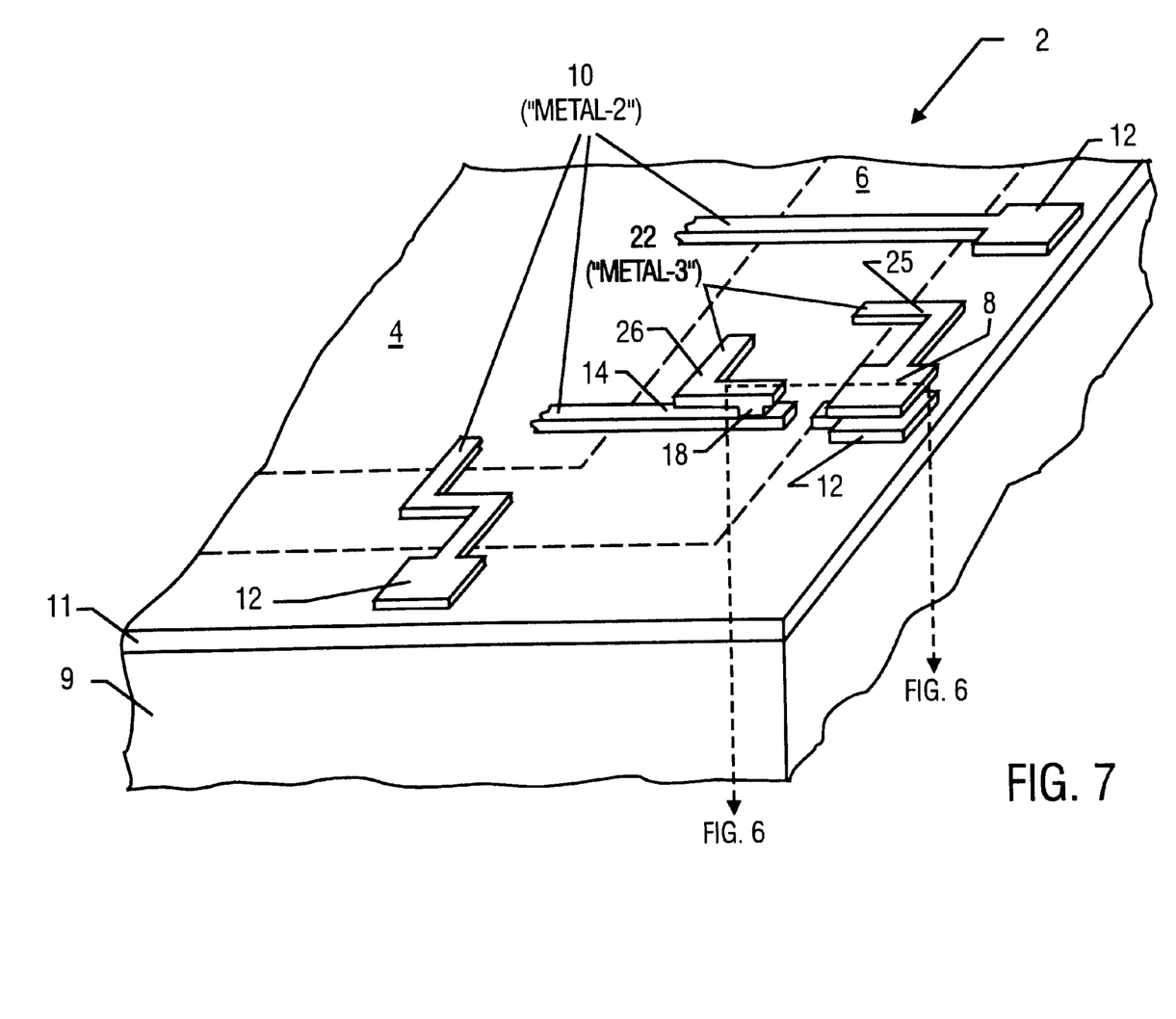
FIG. 7 shows an isometric view of the embedded chip product of FIG. 6, with the dielectric layer removed for clarity.

FIGS. 6 and 7 show the structure of FIG. 5A after the "metal-3" layer 22 has been etched in the areas not protected by the photoresist layer 24, and after the photoresist layer 24 has been removed. (In FIG. 7, the dielectric layer 16 between the "metal-2" layer 10 and the "metal-3" layer 22 has been removed for clarity). This etch, referred to herein as the "reconfiguration etch," performs three important functions. First, it defines the final bond pads 8 to be used in the completed embedded chip product 2. Notice that the final bond pads 8 are located over the intermediate probe pads 12. Second, it defines the "metal-3" leads, such as leads 25 and 26, which are ultimately connected to the logic circuitry 6 through vias (not shown) similar in structure to the via 18. Third, it etches the "metal-3" layer 22 in the opening 20 and the exposed "metal-2" layer 10 underlying the opening 20, thereby disconnecting the "metal-2" lead 14 from the intermediate probe pad 12. In this manner the bond pad area is "reconfigured" so that it no longer communicates with the embedded memory array 4 (i.e., by way of intermediate probe pad 12 and "metal-2" lead 14), but instead communicates with the logic circuitry 6 (i.e., by way of "metal-3" lead 25). FIG. 7 only shows the reconfiguration of one of the intermediate probe pads 12, but during manufacture it is possible to reconfigure all of the intermediate probe pads 12 similarly.

Figures 8, 9:
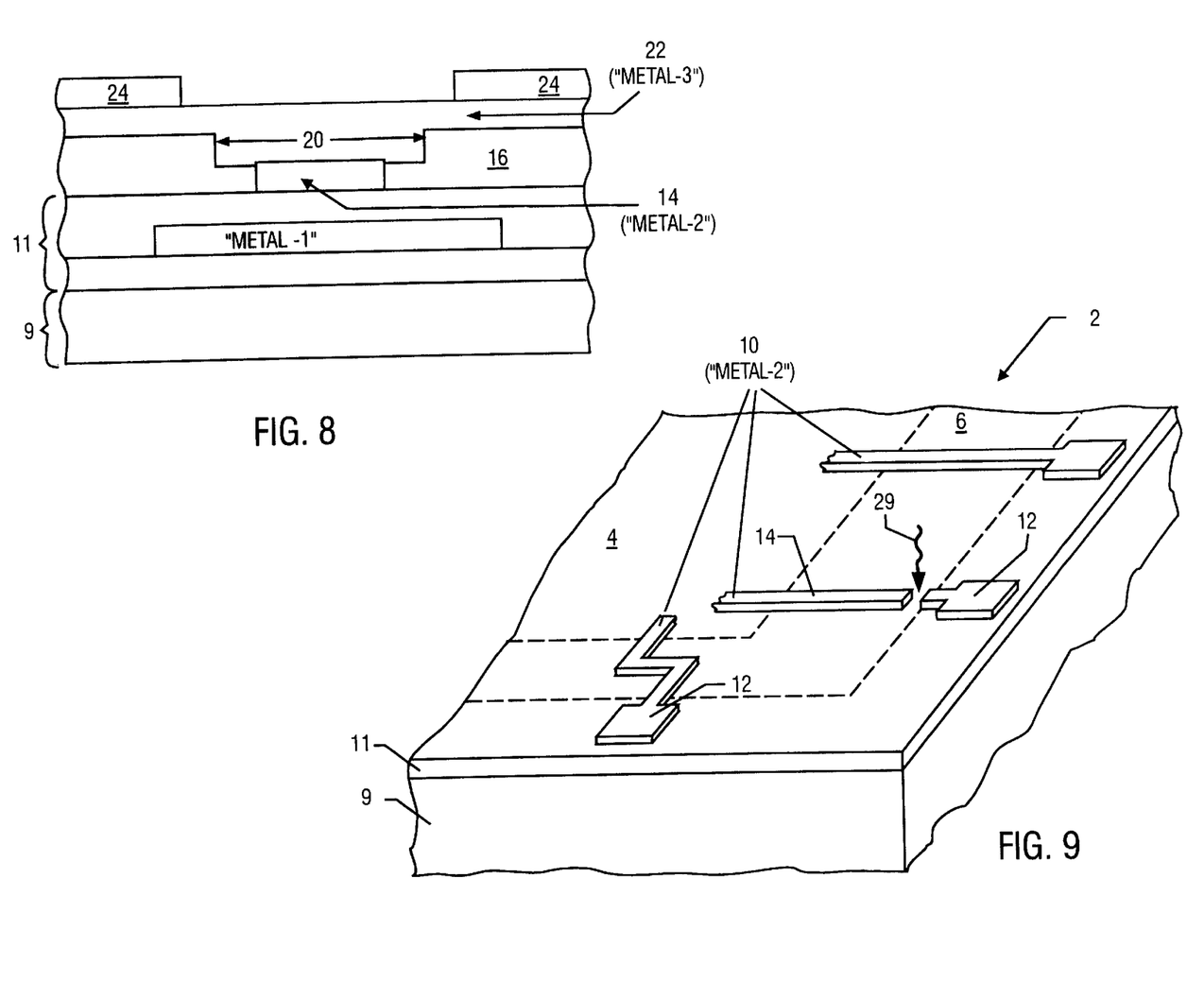
FIG. 8 shows a cross section perpendicular to the cross section of FIG. 5A, and illustrates the relative widths of the lead, the opening, and the photoresist.
FIG. 9 shows the structure of FIG. 2 following laser ablation to sever one of the leads from its intermediate probe pad.

To properly isolate the "metal-2" lead 14 from the intermediate probe pad 12 using the reconfiguration etch, the opening 20 should preferably be made slightly bigger in width than the "metal-2" lead 14 to ensure that the reconfiguration etch will sever the lead 14. Similarly, the photoresist layer 24 should preferably be made slightly bigger than the width of the opening 20. This is illustrated in FIG. 8 (a perpendicular cross section of the cross section shown in FIG. 5A). This sizing consideration is more significant if dry etching is used for the reconfiguration etch, but is of lesser concern if isotropic wet etching is used.

The reconfiguration etch is especially useful because it does not require any additional processing steps over what would normally be called for in a conventional multilevel metal process. The only modification that needs be made to a conventional multilevel metal process is "overetching" of the "metal-3" layer 22 to properly clear the "metal-3" layer 22 from within the opening 20 and the "metal-2" layer 10 underneath the opening 20. For example, suppose that both the "metal-3" and the "metal-2" layers 22, 10 are comprised of an industry-standard aluminum alloy, such as an aluminum-copper-silicon alloy (with approximately 0.5% copper and 1.0% silicon). Using a traditional dry-plasma anisotropic aluminum etch, it should take about 1 minute to clear an approximately 1 micron thick (labeled as dimension "x" in FIG. 5A) "metal-3" layer 22 that overlies the dielectric layer 16 to pattern the "metal 3" leads, such as leads 25 and 26. However, because the "metal-3" layer 22 within the opening 20 and the underlying "metal-2" layer 10 also have a given thickness (labeled "y" and "z" respectively), the etch time will need to be adjusted to ensure proper removal of the metal from these areas. Thus, if x=y=z, the etch time will need to be adjusted to approximately three times the amount needed (i.e., 3 minutes) to pattern the "metal-3" leads in a standard multilevel metal process.

One of ordinary skill will realize that several suitable, industry-standard etchants for the dry etching of aluminum may be utilized during metal patterning and bond pad reconfiguration. Examples of suitable aluminum alloy etchants are $Cl_2$, $BCl_3$, $CCl_4$ and $SiCl_4$. The etch times, temperatures, gas flow rates, pressure and other metal etch parameters will necessarily depend on the etchant used, as one of ordinary skill will realize. A suitable industry standard plasma etch for the disclosed aluminum alloy requires the use of a $BCl_3+Cl_2$ chemistry at approximately 55 degrees Centigrade, 10 mTorr of pressure, and a plasma power of 500W.

Figure 5B:
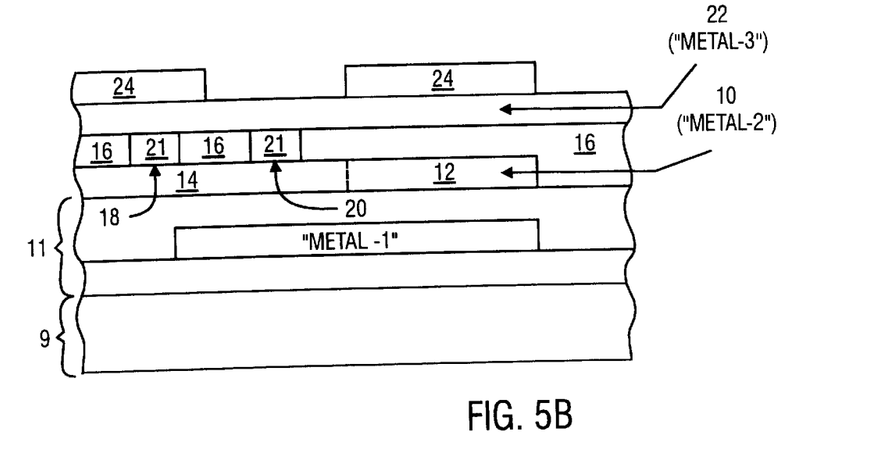
FIG. 5B shows a modification to the process shown in FIG. 5A in which a "plug" process is used to fill the via and the opening.

Furthermore, if a different conductive layer 21 is used to fill both the via 18 and the opening 20, as shown in FIG. 5B, the etch used to clear the opening 20 may need to be modified. For example, if the opening 20 is filled using an industry standard tungsten plug process, the overlying "metal-3" layer 22 may first need to be etched using a suitable aluminum alloy etchant (e.g., $BCl_3+Cl_2$) to pattern the "metal-3" leads 25, 26, followed by a suitable tungsten etchant (e.g., $SF_6$ or $NF_3$) to clear the opening 20, followed again by the suitable aluminum alloy etchant to clear the "metal-2" layer 10 underlying the opening 20. The parameters of the tungsten etch process are similar to those used to etch the aluminum alloy, and will etch approximately 0.6 microns of tungsten in one minute. Other plug processes, such as poly plugs, may also be used.

One of ordinary skill will recognize that many different metal compositions could be used during the manufacture of an integrated circuit, and that an appropriate etching process must be chosen to perform the reconfiguration etch. For example, the various conductive layers could be composite layers consisting of two adjacent layers of conductive materials. Many composite layers are known and used in the semiconductor industry, such as aluminum alloy over a titanium or titanium nitride "barrier" layer, or tungsten silicide over doped polysilicon. Such composite layers are beneficial in the construction of a conductive layer because the differing materials will each contribute beneficial properties to the conductive layer. For example, an aluminum alloy is highly conductive, while titanium nitride has good electromigration characteristics. If such composite layers are used, then the reconfiguration etch will need to be modified (as in the tungsten plug process) to ensure that all of the materials comprising the conductive layers are removed by using appropriate industry standard etchants.

The reconfiguration etch could also be performed by using wet etchants. It may also be advantageous to perform a short wet etch "dip" (e.g., in a diluted $H_2SO_4$ or $H_2NO_3$ solution) after the reconfiguration dry plasma etch to remove any conductive residue to ensure that the "metal-2"0 lead 14 has been properly electrically isolated from the intermediate probe pad 12.

Because metal etchants are usually highly selective to the underlying dielectric layers (such as the interlevel dielectric 16), the "overetching" of the "metal-3" layer 22 during the reconfiguration etch should not interfere substantially with the integrity of these layers, although some slight etching of these layers may result (see element 19, FIG. 6). To guard against overetching, other sacrificial structures such as a "metal-1" layer 30 can be placed underneath the opening 20, although such structures are not strictly necessary.

After reconfiguration, and referring again to FIG. 7, the reconfigured final bond pad 8 now communicates with the logic circuitry 6 through the "metal-3" lead 25, and the "metal-2" lead 14 no longer communicates with the intermediate probe pad 12. In this way, the signal passed to the embedded memory array 4 during intermediate testing can be changed from its previous memory array specific function to a signal to be used by the completed embedded chip product 2. For example, suppose that a given intermediate probe pad 12 supplies the "row access strobe" (RAS) signal to the embedded memory array 4 (i.e., DRAM array) through its associated "metal-2" lead 14 during intermediate testing. After pad reconfiguration (and after fully completing the manufacture of the embedded chip product 2), the final bond pad 8 overlying this intermediate probe pad 12 might supply a clock signal (CLK) to the logic circuitry 6 through the "metal-3" lead 25. The "metal-3" lead 25 communicates with the logic circuitry 6 through a via (not shown) extending between the "metal-3" layer 22 and the "metal-2" layer 10. An appropriate portion of the logic circuitry 6 would internally generate the RAS signal needed to operate the embedded memory array 4, and this internal signal would appear at the "metal-3" lead 26 (again, through the use of a via). The internally generated RAS signal is in turn connected to the "metal-2" lead 14 through the via 18 and supplied to the embedded memory array 4.

There are important reasons for disconnecting the intermediate probe pads 12. First, the intermediate probe pad 12 has an inherent capacitance which, if not disconnected, would delay the transmission of the internally generated RAS signal to the embedded memory array 4. Second, both multiprobing (during wafer testing) and thermalsonic bonding (during packaging) of the final bond pads 8 will sometimes cause cracking in the dielectric layer 16 between the final bond pads 8 and the intermediate probe pads 12, causing these pads to short together. Therefore, disconnecting the intermediate probe pad 12 ensures that this unwanted result will not result in circuit failure.

By positioning the final bond pads 8 over the intermediate probe pads 12, the intermediate testing procedure is simplified. First, the same probe card can be used to test both the embedded memory array 4 (i.e., during the intermediate testing) and the completed embedded chip product 2 (i.e., during final testing). Of course, differing test patterns must be supplied by the multiprobe tester to the probe card to reflect the signal to be supplied to the relevant bond pad during testing (e.g., RAS for intermediate testing or CLK for final testing). Second, because the bond pads take up a fair amount of space on the chip's surface, the overlapping of the intermediate 12 and final 8 bond pads ensures that a minimal amount of chip space is taken up by the bond pads. Because the embedded memory array 4 will usually require less signals than will the completed embedded chip product 2, not every final bond pad 8 will necessarily have an operational intermediate probe pad 12 underneath it, although a "dummy" (i.e., unconnected) pad may be formed so that the probe card will have a pad with which to make contact during intermediate testing.

While the embedded chip product 2 is fully functional after the patterning and etching of the "metal-3" layer 22, a passivating layer will usually be placed on the surface of the chip 2 to protect the circuitry prior to final multiprobe testing and packaging. The passivating layer is typically a silicon oxide or silicon nitride and can be formed using several techniques known to those of ordinary skill in the art. The final bond pads 8 are made accessible by etching holes in the passivating layer where it exists over the final bond pads 8.

Other structures, such as Electro-Static Discharge (ESD) circuitry, will usually be connected to the final bond pads, and may also be connected to the intermediate probe pads 12 if desired. Appropriate ESD circuits are well known in the art and are not disclosed herein so as not to obscure the inventive aspects of this disclosure.

Bond pad reconfiguration may be realized in other ways other than the use of the disclosed reconfiguration etch. For example, upon completion of "metal-2" patterning (see FIGS. 2 and 3) and intermediate testing, the "metal-2" leads 14 may be severed from the intermediate probe pad 12 by laser ablating 29 a portion of the lead 14, as shown in FIG. 9. Suitable laser ablation techniques are well known in the art and have traditionally been used to program the redundancy circuits of defective chips. After laser ablation, processing could continue per a conventional multilayer metal process as outlined above.

Figure 10:
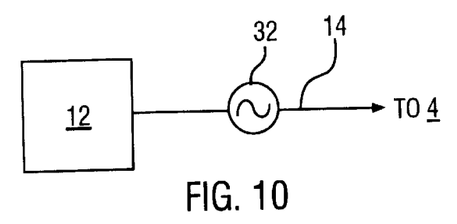
FIG. 10 shows a circuit for severing the lead from its intermediate probe pad using a fuse.

Alternatively, an electrical fuse 32 can be positioned between the intermediate probe pad 12 and the lead 14, as shown in FIG. 10, and can be "blown" to form an open circuit after intermediate testing. Many different types of electrical fuses 32, such as poly fuses, are known to those of ordinary skill in the art of semiconductor manufacturing. After fusing, processing could continue per a conventional multilayer metal process as outlined above. The use of antifuses (i.e., a structure which may be "blown" to form a closed circuit) may also be advantageous in bond pad configuration.

Figure 11A:
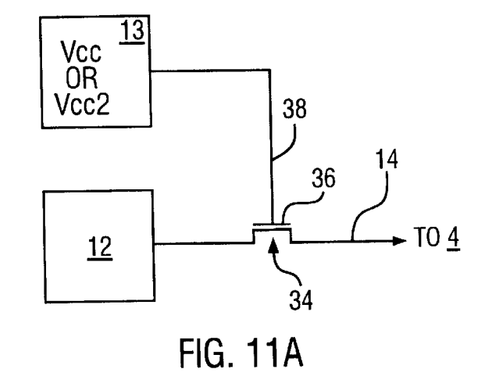
FIG. 11A shows a switch circuit useful for testing the embedded memory during the intermediate manufacturing stage.
Figure 11B:
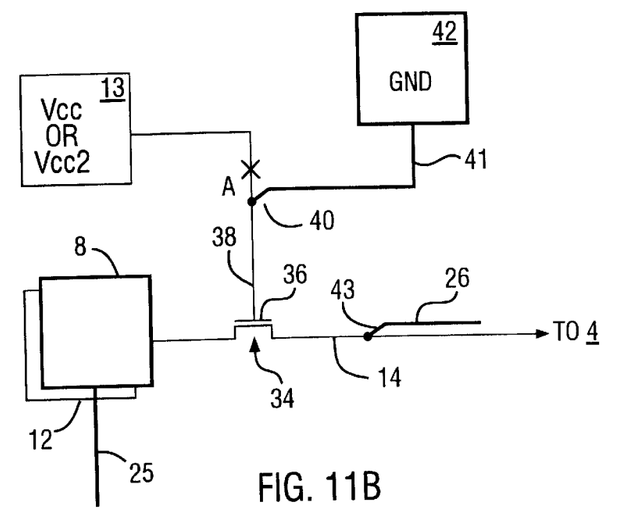
FIG. 11B shows how the switch circuit of FIG. 11A can be modified by subsequent processing to disconnect the lead from its intermediate probe pad.

Another means for reconfiguring the pads is to use an electrical switch, such as an N-channel transistor 34, between the intermediate probe pad 12 and the "metal-2" lead 14, as shown in FIGS. 11A and 11B. FIG. 11A shows the connection of the transistor 34 after "metal-2" patterning. The gate 36 of the transistor 34 can be connected by way of a "metal-2" lead 38 to the power supply voltage Vcc, which is used to power the memory array 4 during intermediate testing. Vcc is delivered into the chip 2 through its own intermediate probe pad 13. Because the gate 36 of the N-channel transistor 34 is at Vcc, the transistor 34 will be "on" and signals can pass between the intermediate probe pad 12 and the "metal-2" lead 14 during intermediate testing. Alternatively, the gate 36 of transistor 34 could be tied in the "metal-2" layer 22 to an auxiliary power supply bond pad 13 (Vcc2), which is not the same Vcc pad used to power the embedded memory array 4. This scheme is advantageous because the voltage supplied to the auxiliary power supply bond pad 13 may be biased higher than the "high" logic levels (i.e., logic '1') supplied to the intermediate probe pads 12 during intermediate testing to ensure that a full logic '1' level can be transferred to and from the "metal-2" lead 14 without a transistor threshold "Vt" drop. (For example, if Vt equals the threshold voltage of transistor 34, then the voltage supplied to the auxiliary power supply bond pad 13 (Vcc2) should equal logic '1'+Vt). Other equivalent circuits could be substituted for the transistor 34, such as a transmission gate (not shown). A transmission gate consists of an N-channel transistor and a P-channel transistor whose sources and drains are tied together. The N-channel transistor would be gated as shown in FIG. 11A. The P-channel transistor would be similarly gated but would instead be connected to a ground (Vss) intermediate probe pad. A transmission gate would ensure that signals could be transmitted to and from the "metal-2" lead 14 without experiencing a Vt drop, without the need for changing the supply voltages from their normal values.

FIG. 11B shows the circuit of FIG. 11A after the processing of the embedded chip product 2 is completed according to a conventional multilevel metal process. Generally, the darker lines schematically represent the "metal-3" layer 22 and "metal-3" to "metal-2" vias. A via 40 (similar in construction to via 18 of FIG. 6) has been formed over the "metal-2" lead 38 and is connected by a "metal-3" lead 41 to the ground signal (GND) provided by a ground bond pad 42 on the completed embedded chip product 2 (i.e., the ground bond pad is one of the many final bond pads 8). Because the intermediate Vcc (or Vcc2) pad is no longer accessible, the ground signal can be transferred through the via 40 and to the "metal-2" lead 38. The lead 38 can be severed at position "A" using the reconfiguration etch, laser ablation, or by an electrical fuse if the capacitance of the intermediate Vcc (or Vcc2) bond pad 13 is undesirable, but this is not strictly necessary. Because the gate 36 of the N-channel transistor 34 is grounded, the transistor 34 will be "off," thereby isolating the intermediate probe pad 12 from the "metal-2" lead 14. As shown in FIG. 7, the "metal-3" lead 26 is connected to the "metal-2" lead 14 by the via 18. If a transmission gate (not shown) is used, the gate of the P-channel transistor would need to be similarly connected to the Vcc final bond pad 8.

The embodiment may be modified such that the location of the intermediate probe pads 12 do not correspond with the final bond pads 8 of the completed embedded chip product 2. For example, the location of the intermediate probe pads 12 could be moved to the edge of the embedded memory array 4. Otherwise, processing and pad reconfiguration may continue after intermediate testing as outlined in FIGS. 4 through 11B above and accompanying text. This modification is advantageous in that a previously designed mask work for a memory chip product (such as a DRAM) can be completely incorporated within the design of an embedded chip product without substantial changes to the location of the bond pads. Thus, the same probe card used to test the memory product can be used to intermediately test the embedded memory chip product. However, this modification is disadvantageous in that there is no overlapping of the intermediate and final pads, and therefore extra space on the surface of the embedded chip product is needed to accommodate the intermediate probe pads.

Those of ordinary skill in the art who now have the benefit of the present disclosure will appreciate that the present inventions may take many forms and embodiments and have many uses. Moreover, those of ordinary skill will realize that the manufacturing details as set forth are merely exemplary ways of reconfiguring a bond pad and that many other ways are possible which do not depart from the invention disclosed herein. Also, the reconfiguration etch could be used for severing of an underlying poly lead or any other suitably conductive material, or for making holes therein. While the reconfiguration etch has been shown particularly useful for disconnecting a lead from intermediate probe pads, it can be used more generally to sever an underlying lead for any number of other reasons.

Other minor changes to the manufacturing process are also possible without departing from the invention in any significant respect. For example, while the embedded chip product 2 can be intermediately tested directly after the patterning of the "metal-2" layer 10, it may also be advantageous to apply a thin layer of dielectric material (a "passivating layer") over the "metal-2" layer 10 to protect the "metal-2" structures during intermediate testing. One of ordinary skill will realize that the passivating layer will need to be etched over the intermediate probe pads 12 so that the pins of the probe card used during multiprobe testing can make electrical contact with the intermediate probe pads 12. The passivating layer need not be removed after intermediate testing, but instead can be incorporated as part of the dielectric layer 16 (see FIG. 4).

Furthermore, the disclosed intermediate testing procedures will be useful in testing more than just embedded memory arrays. They may be used more generally to intermediately test any appropriate subcircuit whose structure is capable of testing during the manufacture of an integrated circuit.

Accordingly, it is intended that the embodiments described herein should be illustrative only, and not limiting with respect to the scope of the present invention. Rather, it is intended that the invention encompass all modifications, equivalents and alternatives falling within the spirit and scope of the invention as defined by the appended claims.

What is claimed is:

1. An integrated circuit, the integrated circuit including a first subcircuit which is fully processed at an intermediate stage during the processing of the integrated circuit and a second subcircuit which is partially processed at said intermediate stage, comprising a plurality of intermediate probe pads for transmitting signals from said tester to the subcircuit to test the subcircuit at the intermediate stage of processing.

2. The integrated circuit of claim 1, further comprising a plurality of final bond pads for transmitting signals from a tester to the integrated circuit to test the integrated circuit after processing of the integrated circuit has been completed.

3. The integrated circuit of claim 2, wherein the plurality of final bond pads overlap the plurality of intermediate probe pads.

4. The integrated circuit of claim 1, further comprising means for disconnecting at least one of the plurality of intermediate probe pads from the subcircuit.

5. The integrated circuit of claim 4, wherein the means for disconnecting includes a fuse.

6. The integrated circuit of claim 4, wherein the means for disconnecting includes an electrical switch.

7. The integrated circuit of claim 4, wherein the electrical switch includes at least one transistor.

8. The integrated circuit of claim 1, wherein the first subcircuit is an embedded memory array.

* * * * *